(12) United States Patent
Beaulieu

(10) Patent No.: US 6,547,510 B1
(45) Date of Patent: Apr. 15, 2003

(54) SUBSTRATE TRANSPORT APPARATUS WITH COAXIAL DRIVE SHAFTS AND DUAL INDEPENDENT SCARA ARMS

(75) Inventor: David R. Beaulieu, Groton, MA (US)

(73) Assignee: Brooks Automation Inc., Chelmsford, MA (US)

( * ) Notice: Subject to any disclaimer, the term of this patent is extended or adjusted under 35 U.S.C. 154(b) by 515 days.

(21) Appl. No.: 09/072,097

(22) Filed: May 4, 1998

(51) Int. Cl.7 ................................................ B25J 18/02
(52) U.S. Cl. ........................ 414/744.5; 901/15; 901/21; 74/490.04
(58) Field of Search .................... 414/744.5, 744.6, 414/937; 901/8, 15, 21; 74/490.01, 490.03, 490.04, 490.05

(56) References Cited

U.S. PATENT DOCUMENTS

| 4,666,366 A | 5/1987 | Davis .......................... 414/749 |
| 4,836,733 A | 6/1989 | Hertel et al. ................. 414/225 |
| 4,951,601 A | 8/1990 | Maydan et al. .............. 118/719 |
| 5,102,280 A | 4/1992 | Poduje et al. ................ 414/225 |
| 5,151,008 A | 9/1992 | Ishida et al. .............. 414/744.5 |
| 5,180,276 A | 1/1993 | Hendrickson ................ 414/752 |
| 5,270,600 A | 12/1993 | Hashimoto .................... 310/75 |
| 5,333,986 A | 8/1994 | Mizukami et al. ........... 414/217 |
| 5,404,894 A | 4/1995 | Shiraiwa ........................ 134/66 |
| 5,447,409 A | 9/1995 | Grunes et al. ............ 414/744.6 |
| 5,577,879 A | 11/1996 | Eastman et al. .......... 414/744.5 |
| 5,584,647 A | 12/1996 | Uehara et al. ............ 414/744.5 |
| 5,647,724 A | 7/1997 | Davis, Jr. et al. ......... 414/744.5 |
| 5,746,565 A * | 5/1998 | Tepolt ....................... 414/744.5 |

FOREIGN PATENT DOCUMENTS

| JP | 4-87785 | * | 3/1992 | ............... 414/744.5 |
| JP | 8-71965 | * | 3/1996 | ............... 414/744.5 |
| WO | WO 94/23911 | | 10/1994 | |

* cited by examiner

*Primary Examiner*—Donald W. Underwood
(74) *Attorney, Agent, or Firm*—Perman & Green, LLP (57) ABSTRACT

A substrate transport apparatus having a drive section and a movable arm assembly connected to the drive section. The drive section has a coaxial drive shaft assembly with independently rotatable drive shafts. The movable arm assembly has two scara arms. Each scara arm has an inner arm connected to a separate respective one of the drive shafts. An outer arm of each scara arm is connected to a rotationally stationary pulley on the drive section by respective transmission belts.

25 Claims, 6 Drawing Sheets

SUBSTRATE TRANSPORT APPARATUS WITH COAXIAL DRIVE SHAFTS AND DUAL INDEPENDENT SCARA ARMS

BACKGROUND OF THE INVENTION

1. Field of the Invention

The present invention relates to a transport apparatus, and, more particularly, to an apparatus and method for transporting substrates.

2. Prior Art

U.S. Pat. Nos. 5,151,008 and 5,577,879 disclose scara arms with end effectors. WO 94/23911 discloses an articulated arm transfer device with a drive section having a coaxial drive shaft assembly.

SUMMARY OF THE INVENTION

In accordance with one embodiment of the present invention, a substrate transport apparatus is provided comprising a drive section and a movable arm assembly. The movable arm assembly is connected to the drive section and has two driven arm assemblies. Each driven arm assembly has an inner arm connected on a common access of rotation with the drive section, an outer arm rotatably connected to the inner arm-to form a scara arm, and a transmission belt connected between the outer arm and a pulley on the drive section.

In accordance with another embodiment of the present invention, a substrate transport apparatus is provided comprising a drive section and a movable arm assembly connected to the drive section. The drive section has a coaxial drive shaft assembly with two independently rotatable drive shafts and a rotationally stationary pulley. The movable arm assembly has a first driven arm assembly connected to a first one of the drive shafts and a second driven arm assembly connected to a second one of the drive shafts. The first driven arm assembly has an inner arm connected to the first drive shaft, an outer arm pivotably connected to the inner arm to form a scara arm, and a transmission member connecting the outer arm to the rotationally stationary pulley.

In accordance with one method of the present invention, a method of transporting substrates is provided comprising steps of providing a substrate transport apparatus with a robot having a drive section with a coaxial drive shaft assembly and a movable arm assembly connected to the drive section. The movable arm assembly has two driven arm assemblies individually connected to respective drive shafts of the coaxial drive shaft assembly. The method further comprises the step of rotating a first one of the drive shafts to thereby move a first one of the driven arm assemblies. The first driven arm assembly has an inner arm that is rotated with the first drive shaft and an outer arm that is rotated relative to the inner arm. The outer arm is rotated relative to the inner arm by a first transmission belt connected between the outer arm and a rotationally stationary pulley on the drive section.

In accordance with another method of the present invention, a method of transporting substrates is provided comprising steps of providing a substrate transport apparatus with a drive section having a coaxial drive shaft assembly and a movable arm assembly connected to the drive section, and independently rotating the drive shafts to independently move the two driven arm assemblies. The movable arm assembly has two driven arm assemblies individually connected to respective drive shafts of the coaxial drive shaft assembly. Each of the two driven arm assemblies are limited to only two fully extended positions relative to the drive section. The two fully extended positions for both the drive arm assemblies are about 180° apart.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
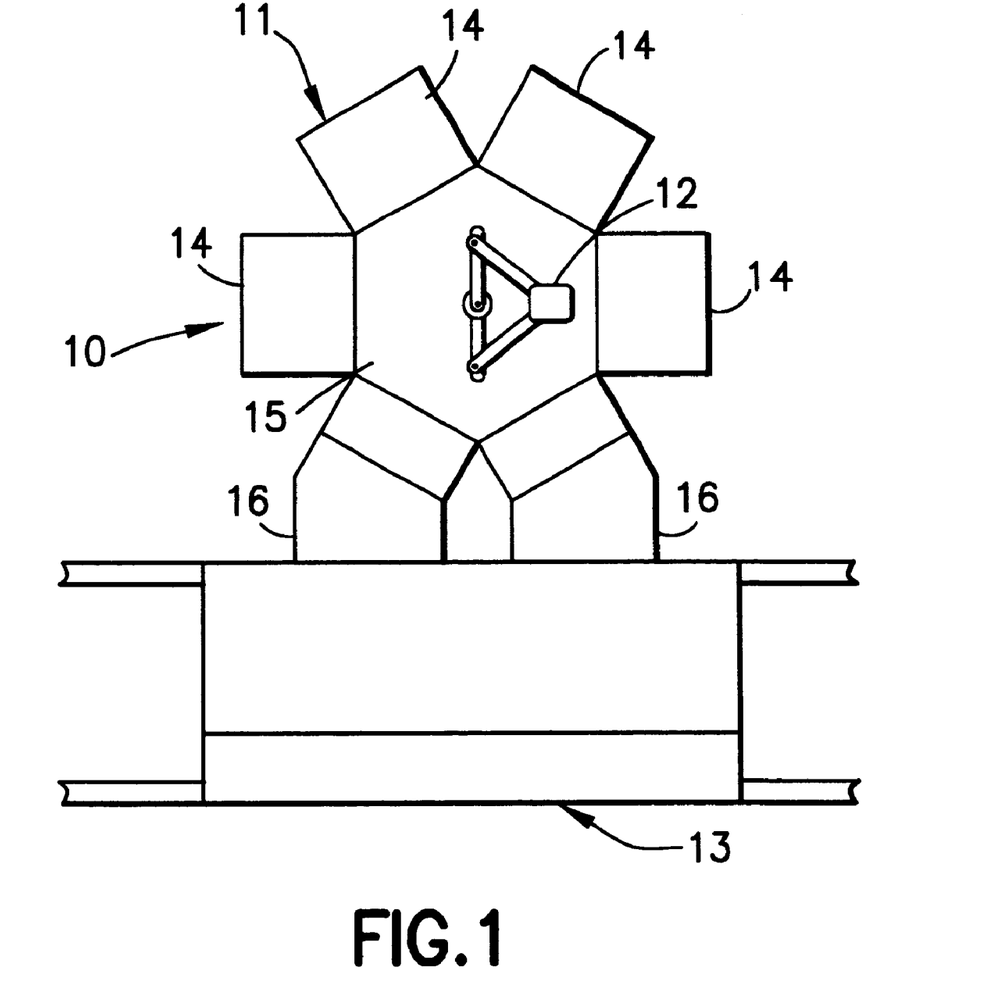
FIG. 1 is a schematic top plan view of a substrate processing apparatus incorporating features of the present invention.

Referring to FIG. 1, there is shown a schematic top plan view of a substrate processing apparatus 10 incorporating features of the present invention. Although the present invention will be described with reference to the single embodiment shown in the drawings, it should be understood that the present invention may be embodied in many different alternative forms of alternate embodiments. In addition, any suitable size, shape or type of elements or materials could be used.

The apparatus 10 generally comprises a substrate treatment section 11 and a substrate loading section 13. The treatment section 11 generally comprises a robot arm transport mechanism 12, substrate processing modules 14 connected to a main chamber 15, and load locks 16. The treatment section 11 may be any one of a number of substrate treatment sections well known in the art. Therefore, the treatment section will not be described further herein.

Figure 2:
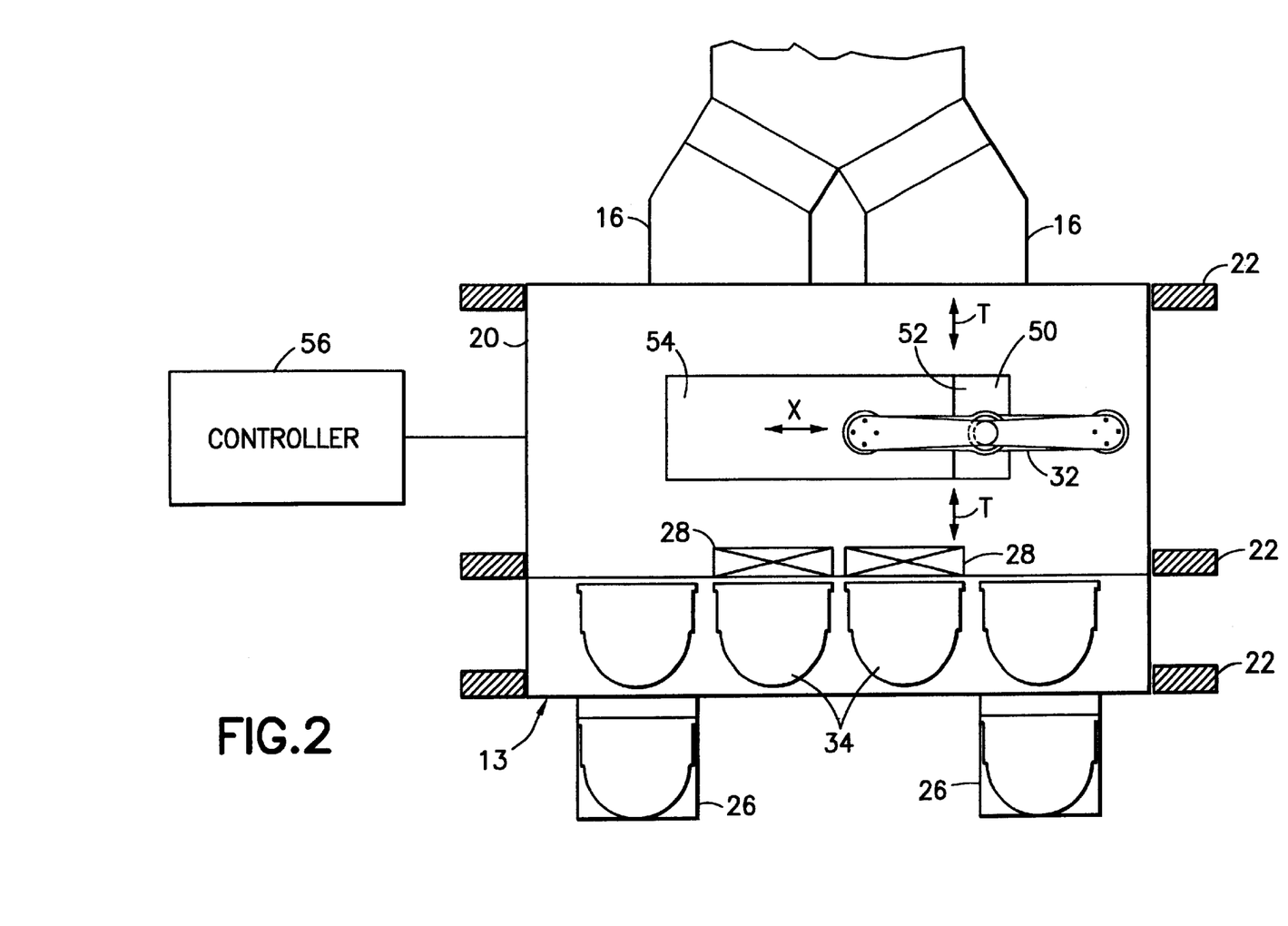
FIG. 2 is a schematic top plan view of the atmospheric section of the apparatus shown in FIG. 1 attached to the load locks.

Attached to the front end of the load locks 16 is the loading section 13. Referring also to FIG. 2, the loading section 13 generally comprises a frame 20 attached to clean room walls 22, a substrate cassette stocker 24, cassette load ports 26, substrate cassette pod door removers 28, and a substrate transport robot 32. The stocker 24 is adapted to hold a plurality of substrate cassettes or capsils 34, such as ten or twenty. The cassettes 34 are well known in the art. Each cassette 34 has a housing which can individually support substrates therein. Customarily the cassettes can support either thirteen or twenty-five substrates. The substrates are semi-conductor wafers, but the present invention could be used with other types of substrates, such as flat panel display substrates. The cassettes could also hold numbers of substrates other than thirteen or twenty-five. The cassettes 34 are loaded and unloaded from the stocker 24 at the load ports 26 by a user. The stocker 24 moves the cassettes to position them in front of the door removers 28. The door removers 28 move doors of the cassettes 34 to allow access to the interior of the cassettes by the robot 32. The tool stocker 24 preferably has the capacity to hold twenty 300 mm, 13 wafer capsils or ten 300 mm, 25 wafer capsils. The two door removal mechanisms 28 are for synchronous capsil access. The load ports 26 have an automatic door as well as an automatic tray. The tool stocker 24 preferably maintains a better than Class 1 environment internally. The tool stocker preferably has a dedicated controller. The load locks 16 are also preferably designed to support a plurality of the substrates individually in a spaced stack.

Figure 3:
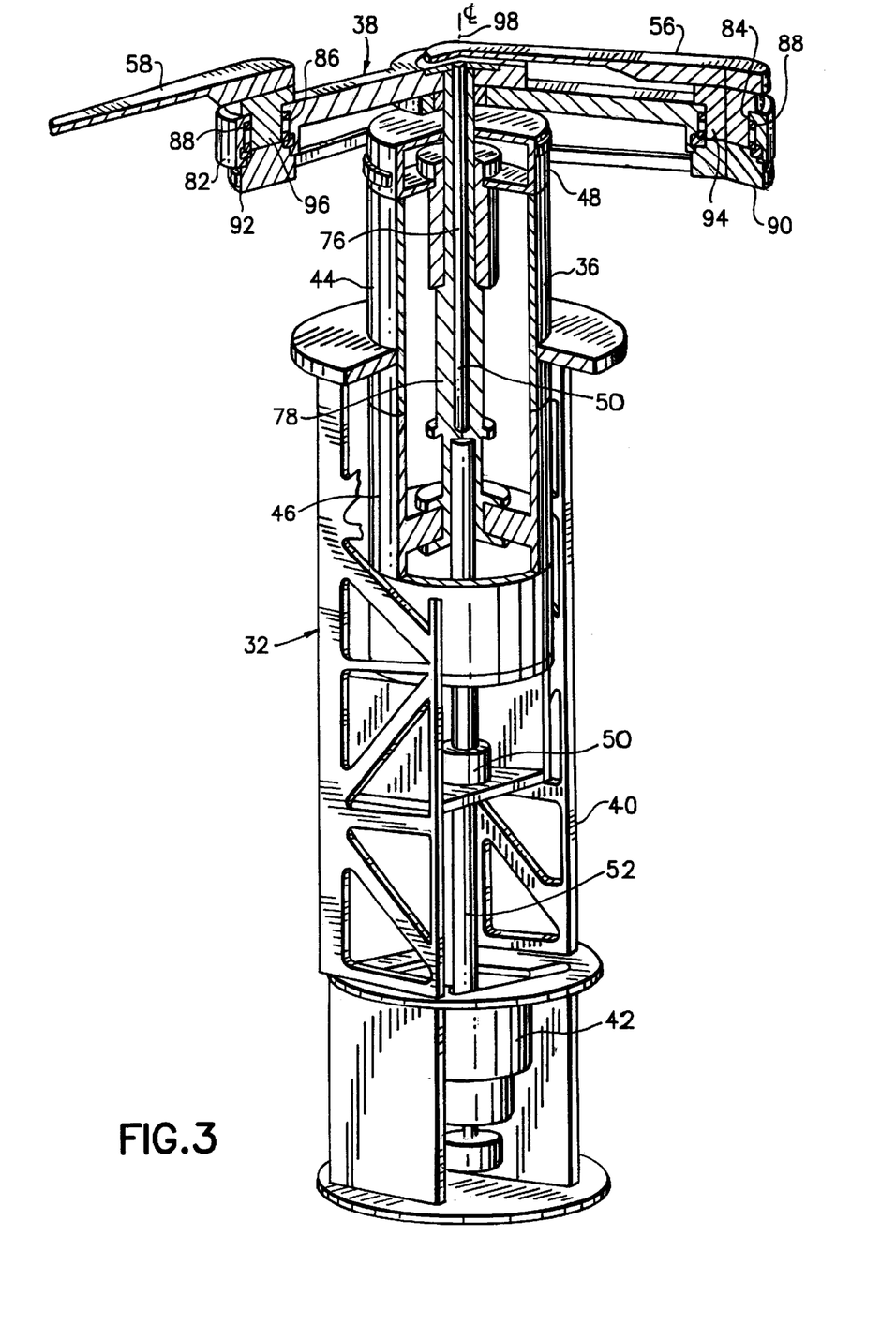
FIG. 3 is a perspective view with a cut-away section of the substrate transport robot used in the atmosphere loading section shown in FIG. 2.

Referring also to FIG. 3, the substrate transport robot 32 generally comprises a drive section 36 and a movable arm assembly 38. The robot 32 is preferably mounted on a movement mechanism 50 for moving the robot 32 linearly relative to the frame 20 as indicated by arrow X. An example of one type of movement mechanism can be found in U.S. patent application Ser. No. 08/891,523 which is hereby incorporated by reference in its entirety. The movement mechanism 50 includes a car 52 mounted on a track of the frame 20 to move the car 52 along the area 54. The robot 32 and the movement mechanism 50 are connected to a controller 56, such as a computer. The controller 56 is adapted to control movement of the movement mechanism 50 and robot 32 to provide three motions for the end effectors; X, T and the Z or vertical direction. This is used to move the substrates, via the movement mechanism 50 and robot 32 among the source and target locations; cassettes 34, and load locks 16. Preferably the controller 56 has a preprogrammed method which can interact with the operation and control of the controller of the substrate treatment section 11 and, more specifically, with the opening and closing of the front doors to the load locks 16. The drive section 36 is preferably a magnetic drive system having a drive shaft assembly such as disclosed in U.S. Pat. No. 5,270,600 which is hereby incorporated by reference in its entirety. In this embodiment the drive section 36 also 5 has a frame 40, a vertical drive section 42, two magnetic drive sections 44, 46, a pulley 48 and a coaxial drive shaft assembly 50. The frame 40 has a general cage shape with an open front. The frame 40 is stationarily attached to the car 52. The two magnetic drive sections 44, 46 have housing that are mounted to tracks of the frame 40 for vertical longitudinal movement along the frame 40. The vertical drive section 42 has a housing that is attached to the bottom of the frame 40 and a screw shaft 52 that is attached to a screw fitting 54. The screw fitting 54 is stationarily attached to the bottom of the drive section 46. The coaxial drive shaft assembly 50 has an inner shaft 76 and an outer shaft 78. A similar drive section is disclosed in U.S patent application Ser. No. 08/873,693, filed Jun. 12, 1997, which is hereby incorporated by reference in its entirety. However, in alternate embodiments, other types of drive sections could be provided.

Figure 4:
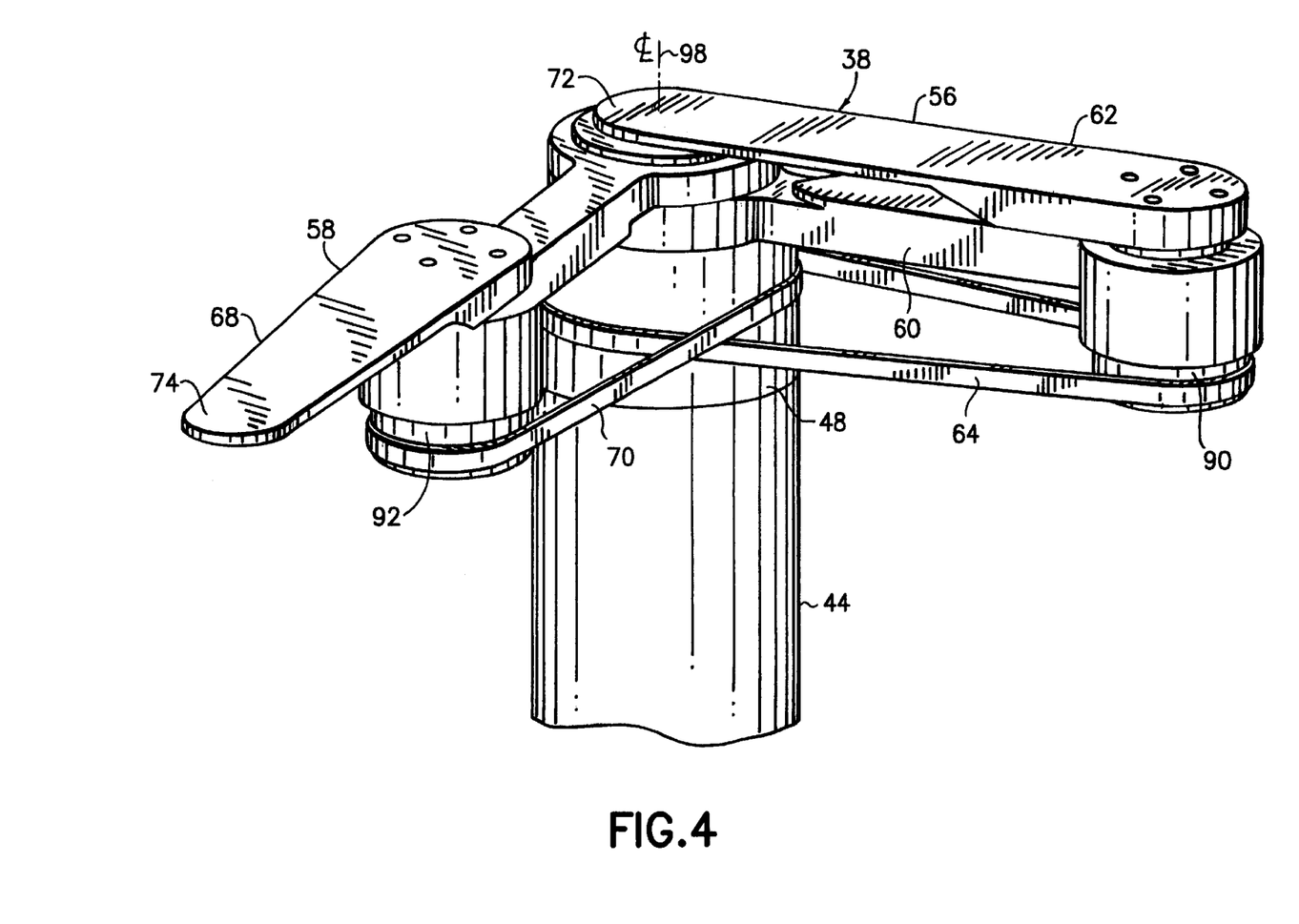
FIG. 4 is a perspective view of the movable arm assembly of the robot shown in FIG. 3.

Referring also to FIG. 4, the movable arm assembly 38 includes a first driven arm assembly 56 and a second driven arm assembly 58. The first driven arm assembly 56 includes a first inner arm 60, a first outer arm 62, and a first transmission belt 64. The second driven arm assembly 58 includes a second inner arm 66, a second outer arm 68, and a second transmission belt 70. The inner and outer arms of each driven arm assembly are respectively connected to each other in series to form two scara arms with outer ends 72, 74 of the outer arms functioning as end effectors to support substrates thereon. The two inner arms 60, 66 are fixedly connected to respective ones of the drive shafts 76, 78. Thus, when the outer shaft 78 is rotated, the first inner arm 60 is rotated therewith. When the inner shaft 76 is rotated, the second inner arm 66 is rotated therewith.

As seen best in FIG. 3, the outer arms 62, 68 are rotatably connected to their respective inner arms 60, 66 at the joints 80, 82. In this embodiment the joints have holes 84, 86 through the inner arms 60, 66, bearings 88, rollers 90, 92, and shafts 94, 96. The first joint 80 has its shaft 94 and roller 90 stationarily connected to the first outer arm 62. The second joint 82 has its shaft 96 and roller 92 stationarily connected to the second outer arm 66. The bearings 88 rotatably support the shafts 94, 96 in the holes 84, 86.

The two transmission belts 64, 70 are mounted between the pulley 48 and their respective rollers 90, 92. The pulley 48 is stationarily connected to the top of the top drive section 44. Thus, the pulley 48 vertically moves with the drive sections 44, 46, but is rotationally stationary relative to the frame 40 and the housings of the drive sections 44, 46. In this embodiment, the two inner arms 60, 66 are intended to rotate relative to the center common axis of rotation 98 along two substantially separate paths or areas of rotation of about 180° on opposite sides of the drive section 36. The two driven arm assemblies 56, 58 each have three primary positions relative to the drive section 36; a home retracted position, a first direction extended position, and a second opposite direction extended position. The retracted home positions are shown in FIGS. 2 and 5B. In the home positions, the inner arms 60, 66 are oriented generally parallel to the load locks 16 and the stocker 24. The outer arms 62, 68 are oriented directly over their respective inner arms. The first outer end 72 is located below the second outer end 74 with a gap therebetween to allow a substrate on the first outer end 72 to pass beneath the second outer end 74.

Figure 5A:
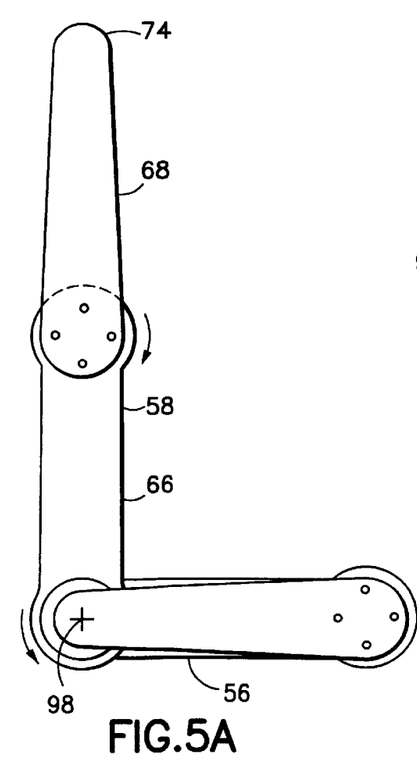
FIGS. 5A–5E are top. plan views of the movable arm assembly shown in FIG. 4 in five different positions.
Figure 5B:
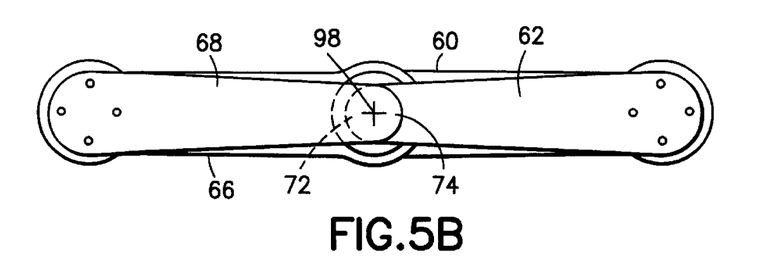
Figure 5C:
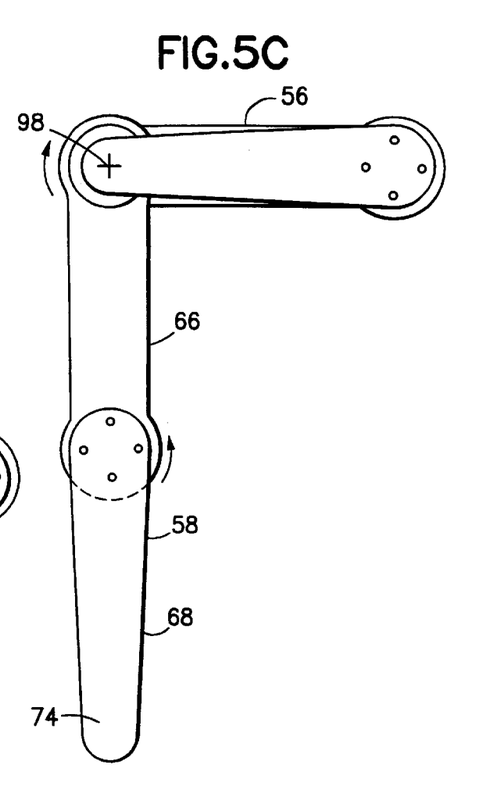

Referring also to FIGS. 5A and 5C, FIG. 5A shows the first driven arm assembly 56 at its home position and the second driven arm assembly 58 at a first extended position. FIG. 5C shows the first driven arm assembly 56 at its home position and the second driven arm assembly 58 at its second opposite extended position. As the second driven arm assembly 58 moves between its first and second extended positions it passes through its home position. In this embodiment the first and second extended positions have the inner and outer arms 66, 68 aligned with each other. However, the fully extended positions could have the inner and outer arms slightly angled relative to each other, such as when the arc of rotation of the inner arm 66 is less than 180°. The position of the inner arm 66 is directly controlled by the angular position of the inner drive shaft 76. The position of the outer arm 68 relative to the inner arm 66 is directly controlled by the second transmission belt 70. Because the pulley 48 is rotationally stationary, as the inner arm 66 is rotated above the center axis of rotation 98, the second transmission belt 70 causes the roller 92 to rotate relative to the end of the second inner arm 66. Because the roller 92 is connected to the rear end of the outer arm 68 by the shaft 96, this causes the outer arm to rotate in an inward direction and then outward again between the two extended positions (passing through the home position shown in FIG. 5B). The car 52 (see FIG. 2) can be moved to allow the end 74 to be inserted into and removed from either one of the load locks 16 or the two cassettes 34 at the door removers 28.

Figure 5D:
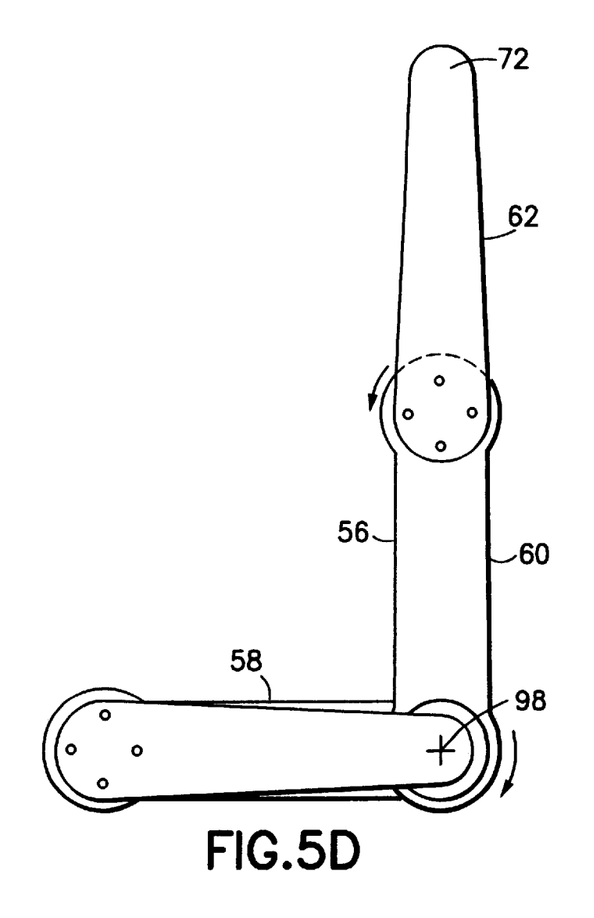
Figure 5E:
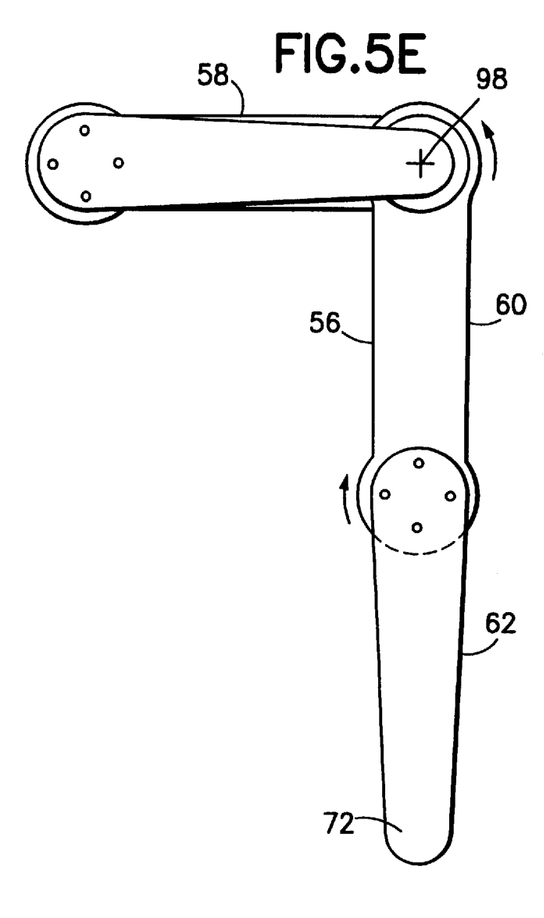

Referring also to FIGS. 5D and 5E, FIG. 5D shows the second driven arm assembly 58 at its home position and first driven arm assembly 56 at a first extended position. FIG. 5E shows the second driven arm assembly 58 at its home position and the first driven arm assembly 56 at its second opposite extended position. As the first driven arm assembly 56 moves between its first and second extended positions it passes through its home position. In this embodiment the first and second extended positions have the inner and outer arms 60, 62 aligned with each other. However, the fully extended positions could have the inner and outer arms slightly angled relative to each other, such as when the arc of rotation of the inner arm 60 is less than 180°. The position of the inner arm 60 is directly controlled by the angular position of the outer drive shaft 78. The position of the outer arm 62 relative to the inner arm 60 is directly controlled by the first transmission belt 64. Because the pulley 48 is rotationally stationary, as the inner arm 66 is rotated above the center axis of rotation 98, the first transmission belt 64 causes the roller 90 to rotate relative to the end of the first inner arm 60. Because the roller 90 is connected to the rear end of the outer arm 62 by the shaft 94, this causes the outer arm to rotate in an inward direction and then outward again between the two extended positions (passing through the home position shown in FIG. 5B). The car 52 (see FIG. 2) can be moved to allow the end 72 to be inserted into and removed from either one of the load locks 16 or the two cassettes 34 at the door removers 28.

With this embodiment the outer arms 62, 68 are always rotated relative to their respective inner arms 60, 66 in opposite directions of rotation of the inner arms on the shafts 76, 78. The inner arms 60, 66 have a limited arc of rotation of 180° or less. This embodiment only allows pick-up and drop-off of substrates on opposite sides of the robot. The two driven arm assemblies 56, 58 could be extended and retracted at the same time on the same side or opposite sides. The car 52 can move the robot 32 while the driven arm assemblies are in their home positions and while they are between their opposite extended positions.

This new design concept allows for independent dual arm radial motion using coaxial output shafts and a stationary pulley located at the main robot turret. This concept is a dual arm design each consisting of two arm links; the lower link and the upper link (end effector). The operation and design construction of these two arms is consistent between the two arm sets, but with subtle changes to allow an over/under same side end effectors (i.e. end effectors (upper link) do not reside in same plane from one arm to the next). The two arms are configured so that one arm contains the top end effector and one arm contains the lower end effector.

For arm assembly 58, the lower link of the arm is attached directly to the inner output shaft of the coaxial drive. The end effector (upper link) of that particular arm is attached to the lower link at the elbow and is allowed rotational motion but constrained in axial plane using a duplexed bearing set. The end effector (upper link) of that particular arm is driven by a belt, cable, or band which is attached through the roller attached to the end effector (upper link) and to a fixed in rotation pulley at the robot drive.

For arm assembly 56, the lower link of the arm is attached directly to the outer output shaft of the coaxial drive. The end effector (upper link) of that particular arm is attached to the lower link at the elbow and is allowed rotation motion but constrained in axial plane using a duplexed bearing set. The end effector (upper link) of that particular arm is driven by a belt, cable, or band which is also attached through the roller attached to the end effector (upper link) and to the same fixed in rotation pulley the robot drive uses for arm assembly 58.

With the coaxial shaft assembly, the shafts are independently controlled and the robot arms either work together or independent depending on the application. If both arm assemblies 56, 58 work together, both can extend and the robot can lift them at the same time and rate. This mode of operation relies on the wafers resting position and the end effector pitch (distance between them) to be identical. With this design, wafer rest planes and end effectors can be at different pitches if an additional vertical motion is added to the sequence.

Current robot arms used in the wafer and flat panel markets use one of the following arm design types:
SCARA—two link arm (dual opposing or single end effector)
Frog Leg—4 bar linkage (single end effector)
Bisymetric—dual 4 bar linkage (dual opposing end effectors)
Leap frog—dual 4 bar linkage (dual same side end effector)
Dual Arm SCARA—two independent drive SCARA arms (dual same side end effector)

The purpose of the present invention is to improve the concepts used in the Dual Arm SCARA and Leap frog arm designs.

The Leap frog arm allows a wafer swap without rotation in the theta axis by simply having the two end effectors linked through a 4 bar linkage to a common robot concentric shaft drive. These end effectors are located on the same side, but at different elevations. This allows for a wafer swap to occur, but is limited because the arm can not perform dual wafer pick or place at the same time; all linkages are connected to the same drive shafts.

The Dual arm SCARA allows a wafer swap without rotation in the theta axis by using two independently driven SCARA arms operating either at the same time or independently such as in the Leap frog arm. In this case; there is a requirement to have independent arm drives contained within the robot drive. This adds cost and complexity in controls because additional motors are required. The method of drive operation can vary from design, but at the minimum 3 motors are required to perform this pick and place operation with this type of arm. As in the Leap Frog, these end effectors are located on the same side, but at different elevations. This design allows the swap to occur but does not have the limits of dependency of the wafer transfers imposed in the Leap Frog arm.

The present invention, on the other hand, will allow independent or dual wafer transfers from a robot drive with coaxial shafts.

This robot arm can operate in three modes:
1. Swap wafers in the same manner as the Leap Frog arm design. This operation does not require a rotation in theta.
2. Can pick two independent wafers in close proximity (i.e. wafer cassette) with a single pick motion.
3. Can pick multiple wafers at different elevations with the use of an additional vertical axis motion and offset transfer times (pick or place).

The present invention provides:
Independent dual same side arm which departs from Leap frog technology because arms are independently driven.
Departs from Dual SCARA arm because this new concept uses a coaxial drive with only two motors.
In this design the upper link becomes the end effector and therefore is a two link arm which is different than the three link arms typically found in SCARA type arms.
In this design, the wafer rotates as the arm extends in the radial axis because the wafer is attached to the end effector. If alignment is required, a wafer's angular rotation must be known prior to this arms operation. The arm/robot drive can correct for the offset values.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate transport apparatus comprising:

a drive section having a rotationally stationary housing; and a movable arm assembly connected to the drive section, the movable arm assembly having two driven arm assemblies, each driven arm assembly having an inner arm connected on a common axis of rotation with the drive section, an outer arm rotatably connected to the inner arm to form a general cantilevered arm configuration, and a transmission belt connected between the outer arm and a pulley on the drive section, wherein the pulley is fixedly stationarily connected to the housing of the drive section such that the pulley is rotationally stationary.

2. An apparatus as in claim 1 wherein the drive section comprises a coaxial drive shaft assembly having a first drive shaft connected to the inner arm of a first one of the driven arm assemblies and a second drive shaft connected to the inner arm of a second one of the driven arm assemblies.

3. An apparatus as in claim 2 wherein the drive section includes means for vertically moving the coaxial drive shaft assembly and thereby vertically moving the movable arm assembly.

4. An apparatus as in claim 1 wherein each of the two driven arm assemblies are limited to two fully extended positions about 180° apart.

5. An apparatus as in claim 4 wherein a distal end of the outer arm of both the driven arm assemblies pass over the common axis between the two extended positions, wherein the distal end of one of the outer arms is located in a separate horizontal plane than the distal end of the other outer arm to pass over the distal end of the other outer arm.

6. An apparatus as in claim 1 further comprising a frame and a movement mechanism for moving the drive section relative to the frame.

7. An apparatus as in claim 6 wherein the movement mechanism comprises a car movably mounted to the frame to move along a straight linear path on the frame and the drive section is mounted to the car.

8. An apparatus as in claim 7 wherein the drive section comprises a cage stationarily attached to the car, two stacked drive modules attached to only one side of the cage inside the cage, and two rotatable coaxial shafts extending from the drive modules and attached to the movable arm assembly.

9. A substrate transport apparatus comprising:

a drive section having a rotationally stationary housing, a coaxial drive shaft assembly with two independently rotatable drive shafts rotatably connected to the housing, and a pulley stationarily connected to the housing such that the pulley is rotationally stationary; and a movable arm assembly connected to the drive section, the movable arm assembly having a first driven arm assembly connected to a first one of the drive shafts and a second driven arm assembly connected to a second one of the drive shafts, wherein the first driven arm assembly has an inner arm connected to the first drive shaft, an outer arm pivotably connect to the inner arm to form a general cantilevered arm configuration, and a transmission member connecting the outer arm to the rotationally stationary pulley.

10. An apparatus as in claim 9 wherein the drive section includes means for vertically moving the coaxial drive shaft assembly and thereby vertically moving the movable arm assembly.

11. An apparatus as in claim 9 wherein first driven arm assembly is limited to two fully extended positions about 180° apart.

12. An apparatus as in claim 9 further comprising a frame and a movement mechanism for moving the drive section relative to the frame.

13. An apparatus as in claim 12 wherein the movement mechanism comprises a car movably mounted to the frame to move along a straight linear path on the frame and wherein the drive section is mounted to the car.

14. A method of transporting substrates comprising steps of:

providing a substrate transport apparatus with a robot having a drive section with a rotationally stationary housing, a coaxial drive shaft assembly rotatably connected to the housing, and a pulley stationarily connected to the housing to form a rotationally stationary pulley, and a movable arm assembly connected to the drive section, the movable arm assembly having two driven arm assemblies individually connected to respective drive shafts of the coaxial drive shaft assembly; and rotating a first one of the drive shafts to thereby move a first one of the driven arm assemblies, the first driven arm assembly having an inner arm that is rotated with the first drive shaft and an outer arm that is rotated relative to the inner arm, wherein the outer arm is rotated relative to the inner arm by a first transmission belt connected between the outer arm and the rotationally stationary pulley of the drive section.

15. A method as in claim 14 wherein the step of rotating comprises rotating the first drive shaft about 180° to move the first driven arm assembly between two fully extended and opposite positions.

16. A method as in claim 15 wherein a distal end of the outer arm supports a substrate thereon and passes over the coaxial drive shaft assembly when the first driven arm assembly is moved between its two opposite fully extended positions.

17. A method as in claim 16 further comprising rotating a second one of the driven arm assemblies, the second driven arm assembly having an inner arm that is rotated with the second drive shaft and an outer arm that is rotated relative to the inner arm of the second driven arm assembly, wherein a second transmission belt is connected between the rotatably stationary pulley and the outer arm of the second driven arm assembly to rotate the outer arm of the second driven arm assembly relative to the inner arm of the second driven arm assembly as the second drive shaft is rotated.

18. A method as in claim 17 wherein the step of rotating the second driven arm assembly comprises rotating the second drive shaft about 180° to move the second driven arm assembly between two fully extended and opposite positions.

19. A method as in claim 18 wherein a distal end of the outer arm of the second driven arm assembly supports a substrate thereon and passes over the coaxial drive shaft assembly when the second driven arm assembly is moved between its two opposite fully extended positions.

20. A method as in claim 14 wherein the substrate transport apparatus is provided with a frame and a movement mechanism for moving the robot relative to the frame, the movement mechanism having a car movably mounted to the frame with the robot being attached to the car, wherein the method further comprises moving the car along the frame to move the robot with at least one substrate thereon relative to the frame.

21. A method of transporting substrates comprising steps of:

providing a substrate transport apparatus with a drive section having a coaxial drive shaft assembly and movable arm assembly connected to the drive section, the movable arm assembly having two driven arm assemblies individually connected to respective drive shafts of the coaxial drive shaft assembly; and independently rotating the drive shafts to independently move the two driven arm assemblies, wherein each of the two driven arm assemblies is a general cantilevered arm assembly with an inner arm and an outer arm, and transmission belts connect the outer arms to a permanently rotationally stationary pulley on the drive section such that rotation of the inner arms cause the outer arms to rotate relative to their respective inner arms, wherein the permanently rotationally stationary pulley limits the two driven arm assemblies to only two fully extended positions relative to the drive section which are about 180° apart.

22. A method as in claim 21 wherein the step of independently rotating comprises rotating the drive shafts without rotating the pulley to move the substrates on the driven arm assemblies between the fully extended positions through a position over the coaxial drive shaft assembly.

23. A method as in claim 21 wherein the step of independently rotating rotates the two drive shafts in limited angles of fixed rotation of no more than about 180°.

24. A method as in claim 21 wherein the two driven arm assemblies pick up and place substrates on opposite sides of the drive section at substantially the same time.

25. A method of transporting substrates comprising steps of:

providing a substrate transport apparatus with a drive section having a coaxial drive shaft assembly and a movable arm assembly connected to the drive section, the movable arm assembly having two driven arm assemblies individually connected to respective drive shafts of the coaxial drive shaft assembly, wherein the two driven arm assemblies are provided as separate general cantilevered arms;

rotating a first one of the drive shafts in a first direction to extend a first one of the driven arm assemblies in a first direction;

rotating the first drive shaft in a second direction to extend the first drive arm assembly in a second direction, wherein the second direction is generally opposite the first direction;

rotating a second one of the drive shafts in the second direction to extend a second one of the driven arm assemblies in the second direction; and rotating the second drive shaft in the first direction to extend the second drive arm assembly in the first direction, wherein portions of the first and second drive arm assemblies are located in separate horizontal planes with a first one of the portions of the first drive arm assembly passing over a second one of the portions of the second drive arm assembly as the drive arm assemblies are moved between generally opposite extended positions.

* * * * *